Figure 1:
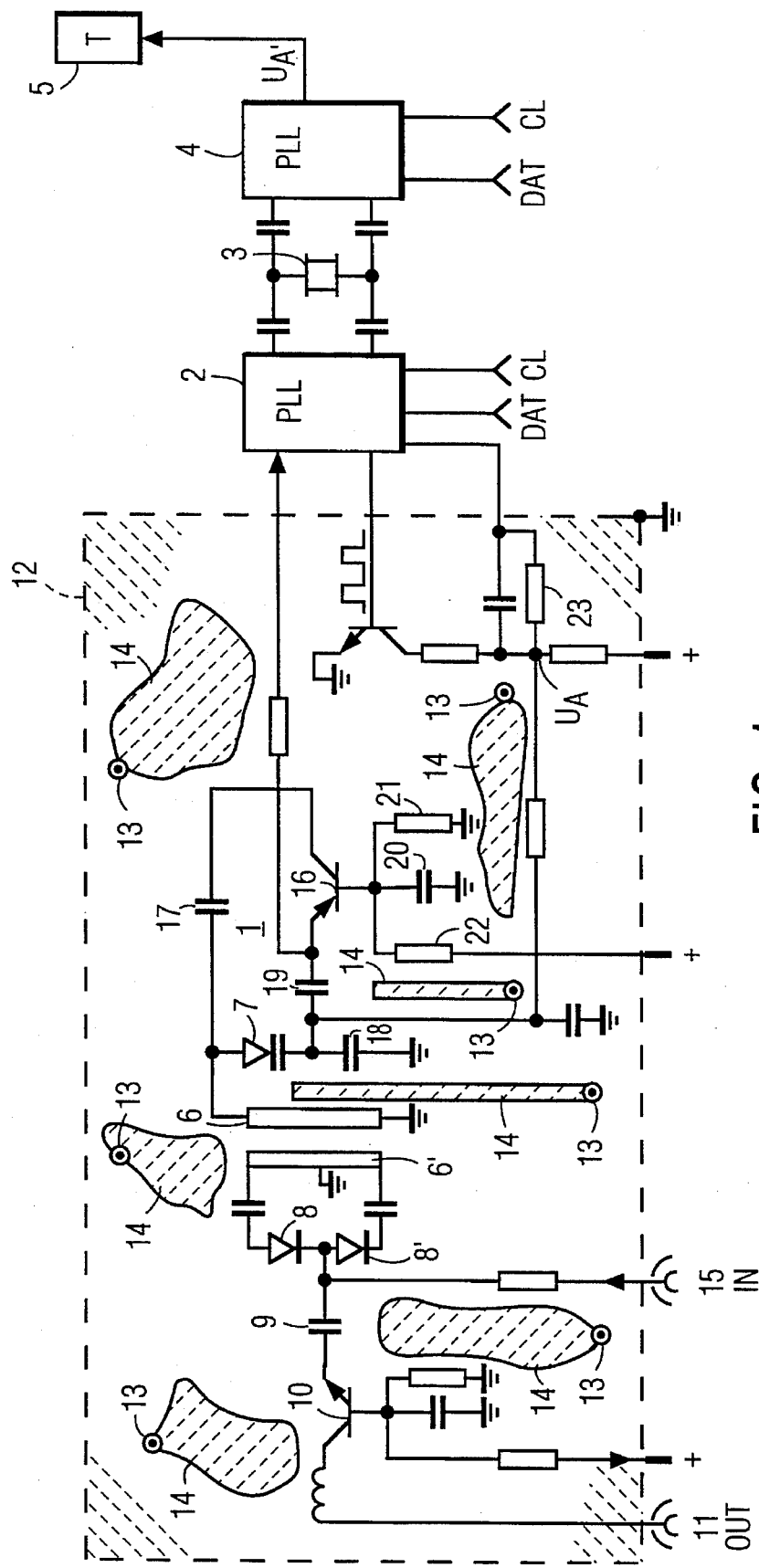

United States Patent [19]

Fischer et al.

[11] Patent Number: 5,561,403
[45] Date of Patent: Oct. 1, 1996

[54] OSCILLATOR AND MODULATOR ARRANGEMENTS ON A CIRCUIT BOARD

[75] Inventors: Bertram Fischer, Deisslingen; Joachim Lange, Villingen-Schwenningen; Gerhard Maier, Dauchingen, all of Germany

[73] Assignee: Deutsche Thomson-Brandt GmbH, Villingen-Schwenningen, Germany

[21] Appl. No.: 262,073

[22] Filed: Jun. 16, 1994

Related U.S. Application Data

[63] Continuation of PCT/EP92/01371, Jun. 17, 1992, continuation of Ser. No. 166,997, Dec. 16, 1993, abandoned.

[30] Foreign Application Priority Data

Jun. 26, 1991 [DE] Germany ............... 41 21 027

[51] Int. Cl.⁶ ............... H03B 5/18; H03C 1/14; H05K 9/00
[52] U.S. Cl. ............... 332/164; 331/99; 331/117 D; 331/117 V; 455/108; 329/354; 329/360; 361/777; 361/818
[58] Field of Search ............... 332/129, 130, 332/163, 164; 331/96, 99, 117 D, 177 V; 455/108; 361/736, 748, 760, 777, 816, 818, 820

[56] References Cited

U.S. PATENT DOCUMENTS

| | | | |
|---|---|---|---|
| 4,140,982 | 2/1979 | Alexander | 332/164 |
| 4,152,671 | 5/1979 | Tuma et al. | 332/152 |

FOREIGN PATENT DOCUMENTS

| | | |
|---|---|---|
| 3328659 | 12/1983 | Germany . |
| 2118392 | 10/1983 | United Kingdom . |

OTHER PUBLICATIONS

Patent Aabsract of Japan, Pub. No. JP1106630, Apr. 24, 1989, vol. 013348 App. No. JP70264649.

Primary Examiner—Siegfried H. Grimm
Attorney, Agent, or Firm—Joseph S. Tripoli; Frederick A. Wein

[57] ABSTRACT

A printed circuit board includes an oscillator and a modulator. The oscillator includes a first printed inductor and a capacitive diode which are printed on one side of the printed circuit board. The modulator includes a second printed inductor coupled to the first printed inductor and printed on the same side of the printed circuit board as the oscillator. A conductive surface at a reference potential is arranged the other side of the printed circuit board and in the vicinity of the oscillator and the modulator and electrically coupled to the oscillator and the modulator using conductive through holes.

1 Claim, 3 Drawing Sheets

OSCILLATOR AND MODULATOR ARRANGEMENTS ON A CIRCUIT BOARD

This is a continuation of PCT application PCT/EP 92/01371 filed Jun. 17, 1992 and U.S. Ser. No. 08/166,997 filed Dec. 16, 1993, now abandoned, by Gerhard Maier, Bertram Fischer and Joachim Lange.

The present invention relates to a circuit board including an oscillator and a modulator.

Arrangements of this type are used e.g. in video recorders in order to convert a video and sound frequency signal scanned from a magnetic tape into a frequency which can be processed by the high frequency circuits in a television receiver in order to then be able to reproduce a reproducible picture on the screen of the television receiver. The modulator consists of two diodes to which there are applied on the one hand, a carrier frequency of some 100 MHz generated by an oscillator, and on the other hand, the video and sound frequency signal. For the avoidance of undesired couplings due to spurious radiation from the oscillator, the latter must be well screened so that the oscillator frequency cannot stray into the numerous inductive elements such as air cored coils and transformers. Usually, a ferrite cored transformer is utilised for coupling out the oscillator frequency. The transformer has to be exactly, symmetrically balanced in order for it to couple symmetrical oscillations at the secondary side of the oscillator into the modulator circuit. The frequency of the oscillator must be exactly tuned. The screening of the oscillator is usually effected with the aid of screening cans which are arranged on both sides of the supporting board. This means, that in addition to the work involved in adjusting, there is a considerable mechanical outlay.

The object of the invention is to develop a modulator arrangement having a wide tuning range of the modulator frequency with a high stability of the modulation depth whilst avoiding elements that need adjustment, whereby the manufacture of such an arrangement can be automated. This object is achieved in that the oscillatory circuit of the oscillator is produced in printed circuit technique with an inductor in combination with a capacitance diode, wherein the printed inductor is coupled to a likewise printed inductor of the modulator and that a conductive surface which is at reference potential is arranged in the region of the oscillator and the mixer on the opposite side of the circuit board, which surface is connected to conductive surfaces arranged in the oscillator and modulator region on the other side of the circuit board.

An embodiment of the invention will be described hereinafter with the help of the drawing.

Figure 2:
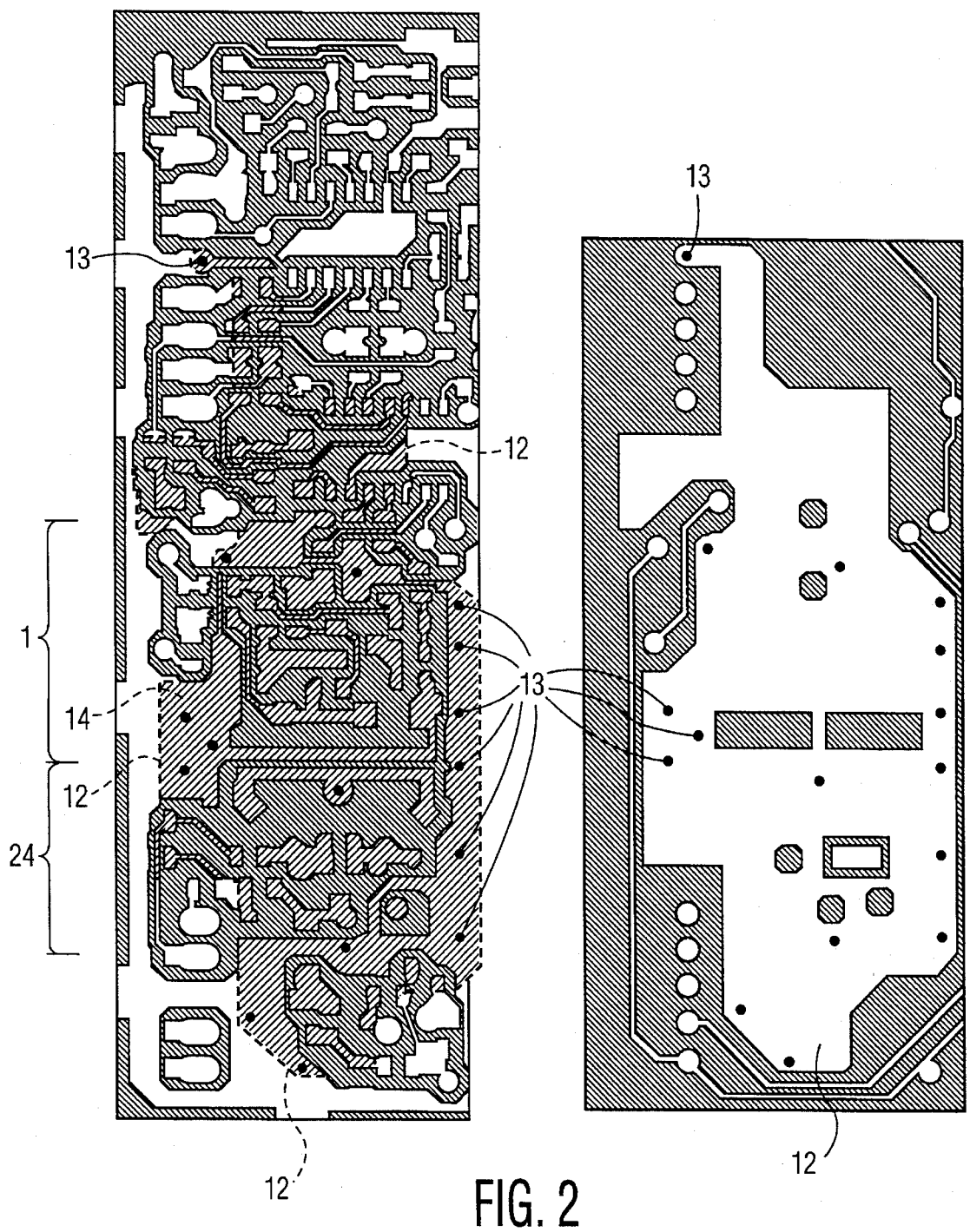
Figure 3:
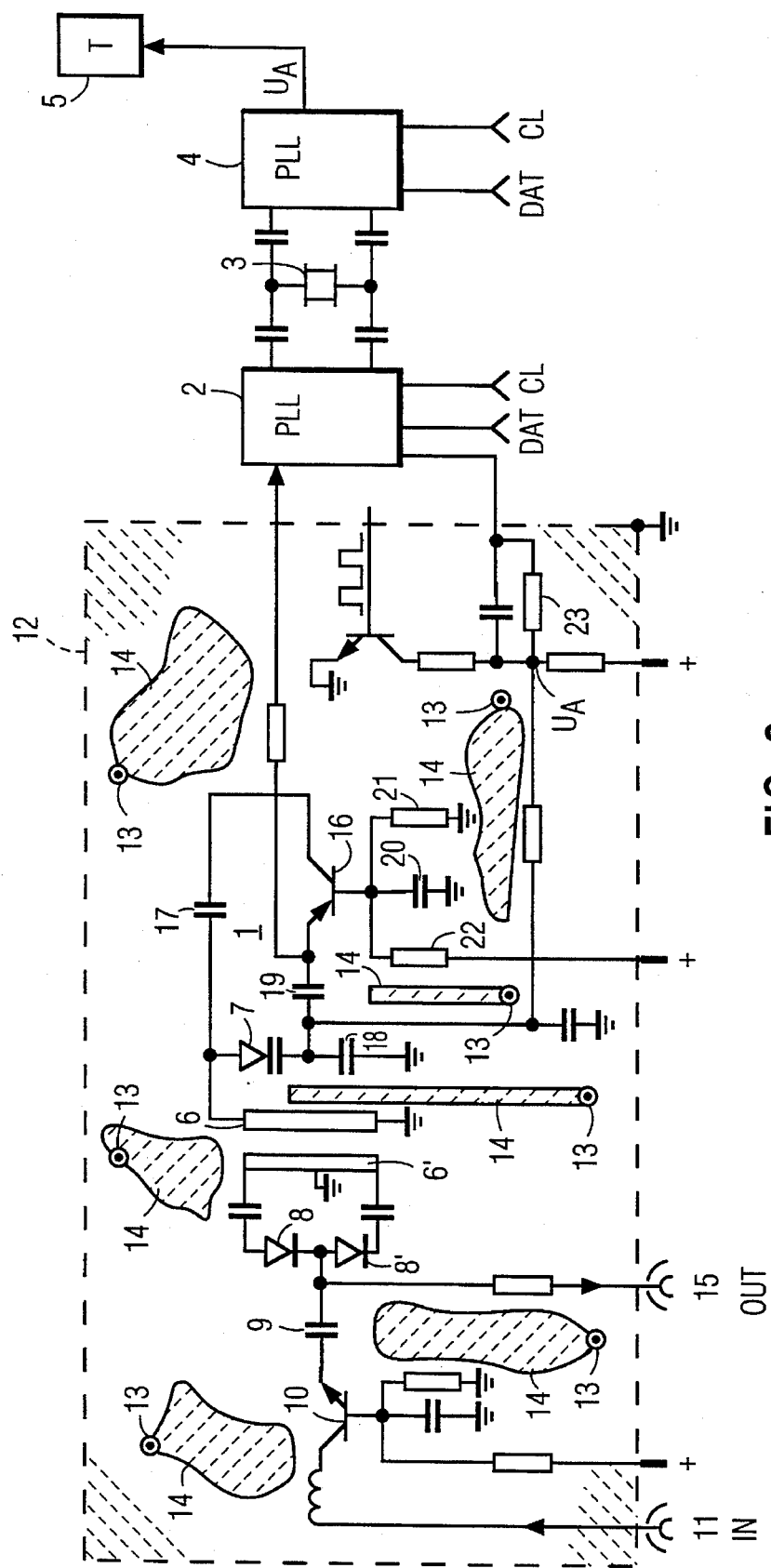

FIG. 1 shows the arrangement in a circuit
FIG. 2 shows an example for a video-sound modulator
FIG. 3 shows an example for a video-sound demodulator In FIG. 1, the invention is described on the basis of the example of a video-sound modulator. The circuit is arranged on a double sided, laminated circuit board. The oscillator, generally referenced 1, has a transistor 16 whose collector is connected via a feedback capacitor 17 to an oscillatory circuit of the oscillator which consists of an inductor 6 constructed in printed circuit technique and a capacitance diode 7 in series with a capacitor 18. The connection point between the capacitance diode 7 and the capacitor 18 is connected via a capacitor 19 to the emitter of the transistor 16 whose base is connected via the parallel connection of a capacitor 20 and a resistor 21 to the reference potential. The base bias voltage is applied to the transistor 16 via the resistor 22. The tuning voltage UA generated by a PLL circuit 2 is supplied via the resistor 23 to the capacitance diode 7. The frequency of the oscillator 1 is stably generated by a quartz 3 and can be adjusted by means of data entry at DAT. The quartz 3 simultaneously serves as a reference for a further PLL circuit 4 which is drawn upon for the generation of the tuning voltage UA' for the tuner 5 of the video recorder. The frequency generated by the oscillator 1 is coupled out via a printed inductor 6'. The inductor 6, together with the capacitance diode 7 and the capacitor 18, forms the frequency determining element of the oscillator 1. Since the output coupling can be produced very precisely in printed circuit technique, a large frequency range from 600 to 850 MHz can also be swept over and thus it is ideally suited for mass production. In addition, the symmetry is precisely determinable due to the construction in printed circuit technique so that an adjustment can be dispensed with. The video and the sound IF input signal (4.5 MHz to 6.5 MHz) is supplied via the terminal 15 to the two modulator diodes 8, 8'. The converted signal is sent via a capacitor 9 and a divider stage 10 to the output 11 from where it is derivable as an antenna signal for a television receiver.

The screening of the oscillator 1 occurs, in a particularly advantageous manner, in the following way. An electrically conductive surface 12, which is enclosed by the dashed line and is at reference potential, is introduced onto the side of the circuit board opposite to that provided with the conductive tracks and the components. The shading shown in the corners of the bordered surface is intended to indicate the electrically conductive surface 12. In the region of this surface 12, the circuit board has a plurality of through contact points 13 which are electrically connected to the symbolically indicated conductive tracks 14 on the opposite side of the board that are embedded in the conductive tracks of the printed circuit. Since, because of the use of a printed circuit technique, air cored coils and a transformer are not used, there results a very good screening against the magnetic field of the oscillations of the oscillator due to the conductive surface 12. The stray field is short circuited by the conductive tracks 14 and the conductive surface 12.

The arrangement of the printed modulator and oscillator circuit (24, 1) is illustrated in the upper part of FIG. 2. The electrically conductive surface arranged on the other side of the board is surrounded by the border 12. The through contact points 13, which allow the upper side of the board to be contacted through to its under side, can be seen. Those conductive surfaces which are in contact with the under side are shown shaded. Thus, areas occur on the upper side which are connected to reference potential. The surface which is arranged on the under side of the board is illustrated in the lower part of the FIG. 2 as it would be seen through the board from above. If one displaces this surface under the upper part of the FIG. 2, the points 13 of the surface 12 coincide with the points 13 in the printed circuit.

The arrangement for a video-sound demodulator is illustrated in FIG. 3. The carrier frequency modulated signal is supplied here to the input 11 and applied via the amplifier 10 to the demodulator diodes 8, 8'. The demodulated signal can be derived at the output 15.

We claim:

1. A printed circuit board comprising an oscillator and a modulator, said oscillator including a first printed inductor and a capacitive diode, positioned on one side of said printed circuit board;

said modulator including a second printed inductor coupled to said first printed inductor and also printed on said one side of said printed circuit board;

a conductive surface at a reference potential and arranged on another side of said printed circuit board and in the vicinity of said oscillator and said modulator and electrically coupled to said oscillator and said modulator using conductive through holes.

* * * * *